United States Patent [19]

Deardorf

[11] Patent Number: 5,672,226

[45] Date of Patent: Sep. 30, 1997

[54] PROCESS OF FORMING MULTILAYER CIRCUIT BOARDS

[75] Inventor: Joan Sharon Deardorf, Novlesville, Ind.

[73] Assignee: Delco Electronics Corporation, Kokomo, Ind.

[21] Appl. No.: 541,002

[22] Filed: Oct. 11, 1995

[51] Int. Cl.$^6$ ................................................. H05K 3/36

[52] U.S. Cl. ..................... 156/288; 156/307.7; 361/790; 174/262; 29/830

[58] Field of Search ........................ 174/262, 263; 361/778, 790; 29/830; 156/288, 293, 299, 307.7, 309.6, 330, 331.5

[56] References Cited

U.S. PATENT DOCUMENTS 5,463,191 10/1995 Bell et al. ................... 174/262

Primary Examiner—Michael W. Ball
Assistant Examiner—Michael A. Tolin
Attorney, Agent, or Firm—Jimmy L. Funke

[57] ABSTRACT

A process is provided for forming multilayer laminated circuit boards characterized by high circuit component density. The process generally employs a pair of plies, each of which is formed to include a dielectric prepreg bonded to a conductive foil. Vias are formed through the dielectric prepregs and conductive foils, and then filled with a conductive material, such as a conductive adhesive or conductive ink, such that the conductive material electrically contacts the conductive foils. Finally, the plies are laminated to opposing surfaces of a clad core laminate composed of a dielectric core between a pair of conductive claddings. The plies are laminated to the core laminate such that the prepregs overlay the conductive claddings of the core laminate. In so doing, the conductive material within the vias electrically contacts the pair of conductive claddings of the core laminate, thereby electrically interconnecting the conductive claddings of the core laminate with the conductive foils.

15 Claims, 2 Drawing Sheets

PROCESS OF FORMING MULTILAYER CIRCUIT BOARDS

The present invention generally relates to multilayer laminated circuit boards composed of multiple conductor layers interlaid with dielectric layers in order to achieve high circuit density. More particularly, this invention relates to a multilayer process for producing high density laminated circuit boards having blind interstitial vias for interconnecting adjacent circuit layers, in which the process involves forming and filling the vias with a conductive material in a manner that promotes reliability of the circuit board while also reducing production and material costs.

BACKGROUND OF THE INVENTION

High density circuit boards have become highly desirable within the automotive, computer and mobile telecommunications industries as space limitations become more severe. Such circuit boards are generally constructed of a cured dielectric core on which multiple alternating layers of conductor and dielectric layers are laminated to form a multilayer structure of a desired number of circuit layers. The conductor layers form runners that are electrically interconnected with different circuit components on the surface of the circuit board, while the dielectric layers electrically insulate the successive conductor layers from each other. Metallized interstitial holes, referred to as vias, are necessary between adjacent conductor layers in order to electrically interconnect the conductor layers with their respective circuit components at the surface of the multilayer structure.

Because multilayer circuit boards are highly desirable from the standpoint of maximizing component density, various processes have been sought to enhance product reliability and throughput while reducing processing costs. Conventional processes of the prior art have generally included the use of a cured core whose opposing surfaces are copper clad. The cladding is cleaned, imaged and etched to generate desired conductor patterns on the opposing surfaces of the core. Uncured prepregs formed from a dielectric material, such as epoxy glass, polyimide or aramid paper, are then placed next to the opposite surfaces of the core, each of which is followed by a copper foil. This sandwich of core, prepregs and copper foils is then laminated to form a multilayer structure, such that a prepreg lies between the core's cladding and each of the copper foils. Blind vias are then formed through the foils and prepregs by control-depth drilling, laser drilling or plasma etch, depending on the particular dielectric material used for the prepreg, stopping short of the core. Copper plating follows to fill the vias and electrically interconnect the core's cladding with the copper foils at the surface of the multilayer structure. Thereafter, conventional processing continues to finish the circuit board, including imaging, plating and etching the copper foils to develop the desired conductor pattern on the surfaces of the multilayer circuit board.

A shortcoming with the conventional process described above is that the via-forming process, whether by drill, laser or plasma, is very slow, proceeding one panel at a time, and very costly, requiring special drills, lasers or plasma etch chambers. Because the via-forming operation is complicated by the presence of the core, the prior art has proposed various techniques by which the vias are formed prior to the prepregs being laminated to the core. One such technique involves lightly bonding a copper foil to an uncured prepreg formed from a flow-resistant ("no-flow") material, which is then drilled prior to being laminated to a core. However, because uncured dielectric materials of the type used to form conventional prepregs tend to flow during lamination, the no-flow material of this process must be specially formulated to be sufficiently resistant to flow during lamination in order to avoid filling or closing the vias during lamination. A disadvantage to the use of no-flow materials is that they reduce but do not eliminate dielectric flow, necessitating that the size of the vias be typically limited to diameters of not less than about 250 micrometers. Because multilayer circuits strive for maximum density, such extraneous limitations to the minimum size of the vias are undesirable.

Finally, prior art processes using no-flow dielectrics inherently have a limited ability to encapsulate the circuitry on adjacent copper layers of the multilayer structure. However, encapsulation of the circuitry underlying the dielectric is necessary to promote reliability of the circuit board by protecting the copper layers from the operating environment of the circuit board. Consequently, the copper cladding on the core often must have thicknesses of not more than about eighteen micrometers (about 0.0007 inch). Such a restriction significantly limits the current carrying capability of the copper layers, and may prevent the use of the multilayer circuit board for some applications, such as high density engine control designs that require higher current carrying circuits for their inner layers.

Accordingly, it would be desirable to provide a process for producing multilayer laminated circuit boards which does not entail a control-depth drilling operation, nor necessitate the use of a specially formulated no-flow dielectric material for the purpose of preventing the vias from becoming filled by the dielectric material during lamination. Such a process would preferably permit the use of conventional dielectric materials for the prepregs, and enable the use of vias having diameters of less than about 250 micrometers and copper layers having thicknesses of greater than about twenty micrometers in order to maximize the circuit density of the circuit board while promoting the current carrying capacity of the copper layers.

SUMMARY OF THE INVENTION

It is an object of this invention to provide a process for producing a high density multilayer laminated circuit board having blind interstitial vias interconnecting adjacent circuit layers of the circuit board.

It is another object of this invention that the process involves forming and filling the vias with a conductive material in a manner that promotes reliability of the circuit board, while also reducing production and material costs.

It is a further object of this invention that the process entails forming the circuit board from prepregs laminated to a clad core, in which the interstitial vias are formed in the prepregs prior to the prepregs being laminated to the core.

It is yet another object of this invention that the prepregs can be formed of conventional dielectric materials of the type used in multilayer laminated circuit boards.

It is yet another object of this invention to maximize the circuit density of the circuit board while achieving an optimum copper current carrying capability.

In accordance with a preferred embodiment of this invention, these and other objects and advantages are accomplished as follows.

According to the present invention, there is provided a process for forming multilayer laminated circuit boards characterized by high circuit component density. Such circuit boards are generally characterized by a multilayer structure composed of multiple prepreg and conductor layers laminated to a clad core, with each prepreg being formed from a dielectric material so as to insulate its corresponding conductor layer from the core cladding. The conductor layers are electrically interconnected to the core cladding with blind interstitial vias that extend through the prepregs.

Generally, the process of this invention includes providing a pair of plies, each of which is composed of a prepreg that has been lightly bonded to a conductive foil. Vias are formed through the plies and then filled with a conductive material, such as a conductive adhesive or conductive ink, such that the conductive material electrically contacts the conductive foils. Finally, the plies are laminated to opposing surfaces of a clad core laminate composed of a dielectric core between a pair of conductive claddings. The plies are laminated to the core laminate such that their respective dielectric prepregs overlay the conductive claddings of the core laminate. In so doing, the conductive material within the vias electrically contacts the pair of conductive claddings of the core laminate, thereby electrically interconnecting the conductive claddings with the conductive foils of the plies.

According to the above process, the vias are filled prior to the laminating step, and are therefore not susceptible to being filled or closed as a result of the dielectric layers flowing during lamination. As such, the dielectric layers need not be formed from materials that are specially formulated to reduce their tendency to flow during lamination, but instead can be formed from conventional dielectric material used in multilayer circuit board technology. As a result, the dielectric layers are more readily able to encapsulate the conductive claddings of the core laminate during lamination, such that the overall reliability of the circuit board is promoted. An additional advantage to the vias being filled prior to the laminating step is that the via diameters are primarily limited only by the techniques used to form and fill the vias, such that diameters of as little as about one hundred micrometers are possible with this invention.

The above process produces a multilayer laminated circuit board that physically differs from that of the prior art. Most notably, the vias are not plated with a metal, but instead are filled with a conductive material. Furthermore, circuit boards produced by this invention are not required to employ thin copper layers, e.g., on the order of about eighteen micrometers or less, as a result of using a no-flow dielectric material for the prepregs. Consequently, the conductive cladding of the core laminate can have a thickness of up to about fifty micrometers for higher current carrying applications, yet be suitably encapsulated by the prepregs during lamination. Finally, and as noted above, circuit boards produced in accordance with this invention can have vias with diameters of as little as about one hundred micrometers, and potentially less, thereby promoting the density of the circuit board.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 2:
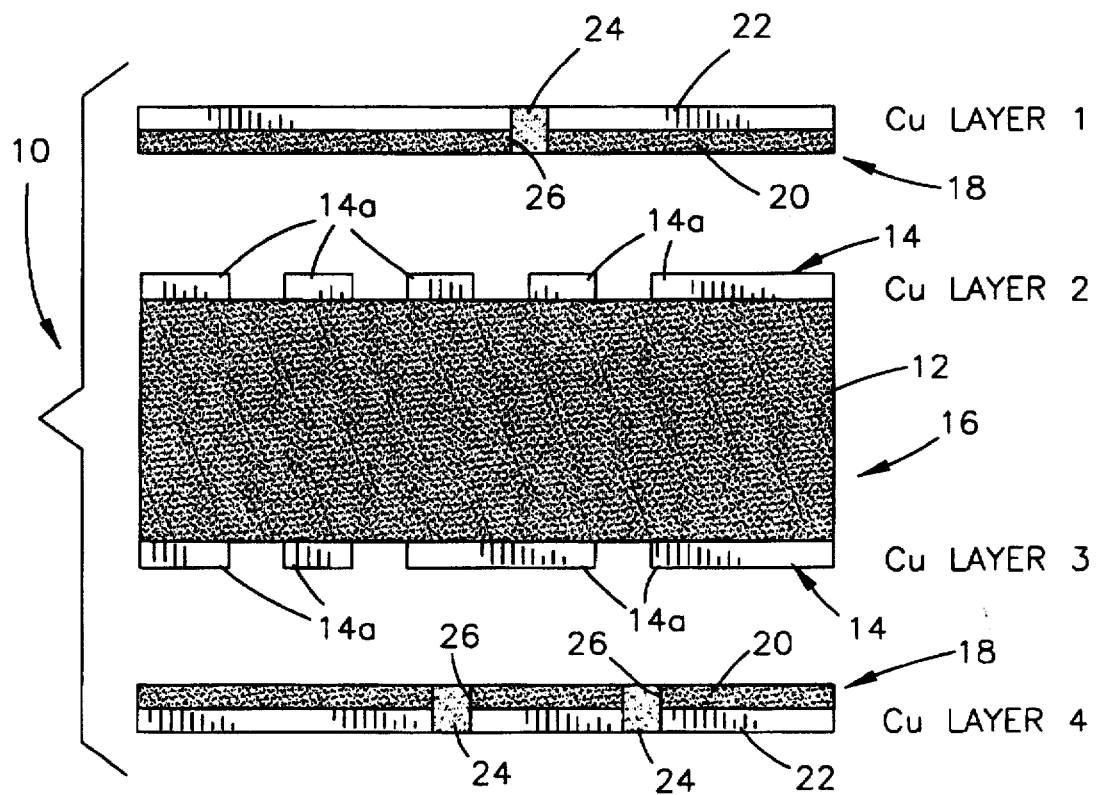
FIG. 2 represents the appearance of the plies following filling of the vias with a conductive material.
Figure 3:
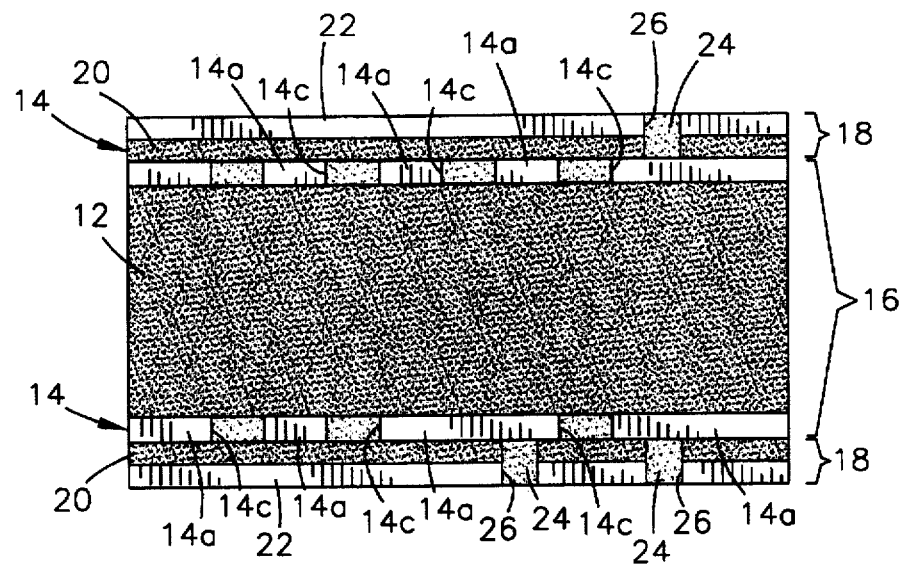
FIG. 3 represents in cross-section the appearance of a multilayer laminated circuit board following lamination of the plies to the clad core.
Figure 4:
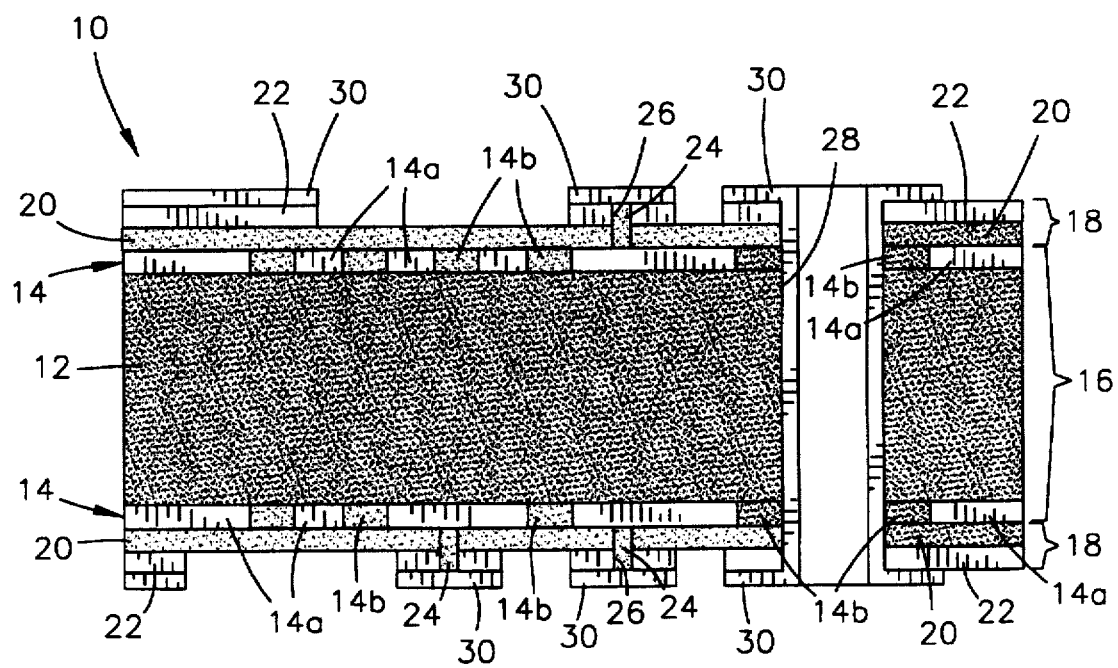
FIG. 4 represents the circuit board of FIG. 3 following the formation of a plated through hole in the circuit board.

Processing steps for producing a multilayer laminated circuit board 10 in accordance with this invention are represented in FIGS. 1 through 4. FIG. 4 represents only a portion of the circuit board 10, more accurately a portion of a laminated panel from which multiple circuit boards 10 are singulated. Furthermore, FIG. 4 is scaled for the purpose of clarity, and is not intended to represent the relative dimensions of the individual components illustrated. The circuit board 10 is shown as including a dielectric core body 12 whose opposing surfaces are overlaid by cladding layers 14 formed of an electrically conductive material, typically copper. The core body 12 may be formed from any suitable dielectric material, such as glass-reinforced epoxy or polyimide. Together, the core body 12 and the cladding layers 14 form a clad core laminate 16, which is formed as a separate constituent of the circuit board 10. As will be described below, the cladding layers 14 form discrete runners 14a separated by dielectric material 14b.

Overlaying the cladding layers 14 are a pair of plies 18, each of which is composed of a dielectric prepreg 20 and a conductor foil 22. As with the core laminate 16, suitable materials for the prepregs 20 and foils 22 are, respectively, glass-reinforced epoxy or polyimide, and copper, though other suitable materials could foreseeably be used. The foils 22 form runners with which circuit components (not shown) are electrically and physically attached to the circuit board 10. Filled vias 24 are shown extending through the plies 18 and electrically interconnecting the foils 22 with the cladding layers 14. As will be explained in greater detail below, the filled vias 24 are composed of an electrically conductive material that entirely fills holes or vias 26 formed through the plies 18. Finally, FIG. 4 illustrates a through hole 28 in the circuit board 10, the through hole 28 being plated with a metal layer 30, such as copper. As is conventional, the through hole 28 and metal layer 30 serve to electrically interconnect circuitry on different layers of the multilayer circuit board 10. While FIG. 4 illustrates the metal layer 30 as interconnecting the conductor foils 22 only, any or all conductive layers of the circuit board 10 could be interconnected if desired.

Figure 1:
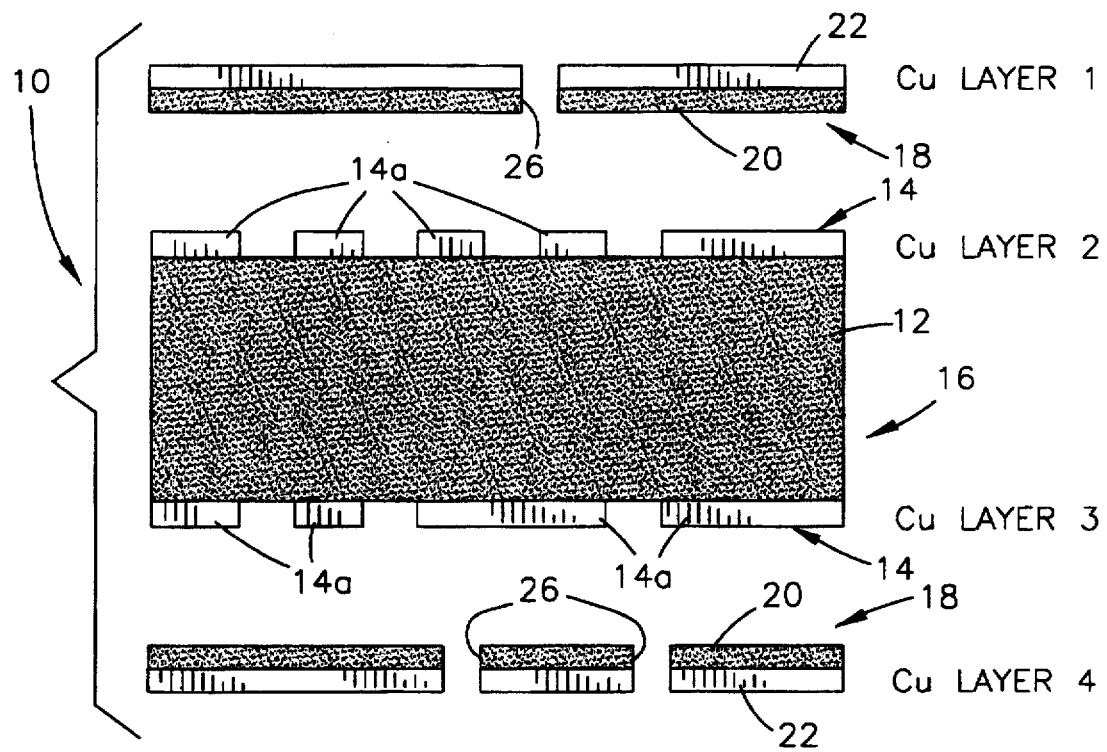
FIG. 1 represents a first step in the process of the present invention, illustrating in cross-section a clad core and a pair of prepreg and conductive foil plies prior to being laminated together, in which interstitial vias are present in each pair of plies.

As noted previously, multilayer laminated circuit boards of the prior art generally are similarly composed of a core to which plies are laminated. However, prior art circuit boards generally utilize plated vias, instead of the filled vias 24 of FIG. 4. Furthermore, the vias of prior art circuit boards are conventionally formed after the plies are laminated to the core, necessitating that a control-depth drilling operation be performed to ensure that the vias extend only through the plies and not into the core. Alternative methods are to form the vias prior to lamination, necessitating that a no-flow dielectric material be used for the prepregs in order to prevent the prepregs from filling or closing the vias during the lamination operation. As can be seen in FIGS. 1 through 3, the process of this invention is contrary to prior art processes, in that both the vias and their metallizations are formed prior to the lamination process, thereby making it unnecessary to form the prepregs from a no-flow material. Further features and advantages of this invention will become apparent with the following discussion of the processing steps represented by FIGS. 1 through 3.

As illustrated in the Figures, the circuit board 10 is composed of a single core laminate 16 and a pair of plies 18 to form a laminated structure having four conductor layers. However, those skilled in the art will recognize that the circuit board 10 could be readily produced to have a six-layer structure by utilizing two core laminates 16 laminated together with a dielectric layer therebetween, in combination with a pair of plies 18 on the outer exposed surfaces of the core laminates 16. As such, though the following discussion of the processing steps of this invention will be directed toward the four-layer structure shown in the Figures, the invention is equally applicable to multilayer circuit boards having any number of conductor layers.

FIG. 1 generally represents an initial condition for the core laminate 16 and plies 18. As noted above, the core laminate 16 and plies 18 would in practice be much larger than that shown, and form part of a laminate panel from which multiple circuit boards are singulated. The core laminate 16 is illustrated as it would appear following conventional processing steps that develop the runners 14a from the cladding layers 14. Such steps generally entail cladding the core body 12 with a suitable conductive material, such as copper, followed by imaging and developing a suitable photoresist (not shown) on the cladding layers 14. The cladding layers 14 are then etched through the photoresist to delineate the runners 14a, after which the photoresist is stripped from the cladding layers 14 and the core laminate 16 is cleaned. The thickness of the cladding layers 14 may be about eighteen micrometers to over about eighty micrometers, with thicknesses generally in the range of about thirty to forty micrometers being sufficient to improve the current carrying capacity of the runners 14a.

The plies 18 are formed by bonding the prepregs 20 to their respective foils 22, such as through the application of light pressure and low temperature for about five minutes. In accordance with this invention, the prepregs 20 can be formed of such conventionally-used materials as uncured epoxy or polyimide, as well as other suitable dielectric resin materials known in the art. In addition, the prepregs 20 can be reinforced with fiberglass, aramid paper, or other suitable fillers known in the art. The thickness of the prepregs 20 is preferably on the order of about twenty-five to about one hundred seventy-five micrometers, though it is foreseeable that lesser or greater thicknesses could be employed in order to provide adequate protection from arcing between conductive layers. A suitable thickness for the foils 22 is about eighteen or about thirty-five micrometers, though lesser or greater thicknesses could foreseeably be used.

Once bonded together, the plies 18 are preferably stabilized, such as by a partial cure or drying, depending on the material from which the prepregs 20 are formed. Thereafter, the vias 26 are formed in each of the plies 18 using any suitable technique, such as drilling, etching, laser drilling or punching, all of which are known in the art. The diameters of the vias 26 may be the same, with smaller diameters being preferred in order to optimize the component density of the circuit board 10. The patterns formed by the vias 26 in the plies 18 will typically differ from each other, as represented in FIG. 1.

Minimum diameters for the vias 26 are generally determined by the technique employed to form the vias 26, the thickness and dimensional stability of the prepregs 20, the thickness of the plies 18, and the ease with which the conductive material used to fill the vias 26 can be deposited within the vias 26. Preferred conductive materials include conductive adhesives and inks. Generally, preferred conductive adhesives are isotropic in terms of their conductivity, and composed of thick mixtures of metal particles, a two-part resin binder such as an epoxy, and a solvent that, upon curing, form an isotropic composition. Because such mixtures are viscous, vias 26 having diameters of about two hundred to about three hundred micrometers are preferred. In contrast, conductive inks are generally less viscous due to being formed of a mixture of metal particles and solvents, requiring an oven dry cycle to form a suitable conductor between the foils 22 and the cladding layers 14. As such, vias 26 having diameters of as little as about one hundred micrometers are compatible with the use of conductor inks. Notably, such a capability is in stark contrast with prior art requirements for via diameters of at least about 250 micrometers in order to prevent filling or closing of the vias with known no-flow dielectric materials.

FIG. 2 represents the appearance of the plies 18 following deposition of the conductive material within the vias 26 to yield the filled vias 24 of FIG. 4. FIG. 3 then represents the appearance of the core laminate 16 and the plies 18 immediately after lamination. A suitable lamination process can be performed in a standard lamination press that produces sufficient heat and pressure to cause the prepregs 20 to melt and flow into voids 14c formed by the patterned copper cladding layers 14, yielding the regions of dielectric material 14b shown. Lamination further serves to cure the prepregs 20, thereby producing a single uniform panel unit in which the prepregs 20 encapsulate all circuitry defined by the cladding layers 14.

Following lamination, the resulting circuit board 10 can be further processed in a conventional manner. For example, the through holes 28 are drilled and then plated, such as by electroless or electroplating steps, resulting in the appearance illustrated in FIG. 4. Thereafter the panel, of which the circuit board 12 forms a part, may be further processed through singulation and testing of the individual circuit boards yielded by the panel.

From the above, it can be seen that an important aspect of this invention is that the process enables the prepregs 20 to be formed from conventional dielectric materials used in multilayer laminated technology. Because the vias 26 are filled prior to the laminating step, the material used to form the prepregs 20 need not be specially formulated to minimize flow of the prepregs 20 during lamination. As a result, the prepregs 20 are more readily able to encapsulate the cladding layers 14 of the core laminate 16 during the lamination process, thereby promoting the overall reliability of the circuit board 10. An additional advantage to the vias 26 being filled prior to the laminating step is that they are not susceptible to being filled or closed during flow of the prepregs 20. Consequently, minimum diameters can be employed for the vias 26 in order to enhance the density of the circuit board 10, with the size of the vias 26 being limited primarily by the techniques used to form and fill the vias 26.

Furthermore, it can be seen from the above that the process of the present invention produces a multilayer laminated circuit board 10 that physically differs from that of the prior art. Most notably, the vias 26 are not plated with a metal, but instead are completely filled with a conductive material. Furthermore, the circuit board 10 is not required to employ thin cladding layers 14 as a result of using a no-flow material for the prepregs 20. Instead, conventional dielectric materials having desirable flow characteristics can be used for the prepregs 20, enabling the cladding layers 14 to have thicknesses of up to about seventy micrometers, which is well in excess of that permitted by the no-flow materials used in the prior art. Finally, and as noted above, circuit boards 10 can be produced in accordance with this invention to have vias 26 with diameters of as little as about one hundred micrometers, and potentially less.

While our invention has been described in terms of a preferred embodiment, other forms could be adopted by one skilled in the art. For example, alternate or additional processing steps and techniques could be employed to form the various layers of the multilayer structure, and materials other than those noted could be used. Accordingly, the scope of our invention is to be limited only by the following claims.

The embodiments of the invention in which an exclusive property or privilege is claimed are defined as follows:

1. A process for forming a multilayer laminated circuit board, the process comprising the steps of:

providing a first dielectric layer bonded to a first conductive foil to form a first ply, and a second dielectric layer bonded to a second conductive foil to form a second ply;

forming vias through the first and second dielectric layers and through the first and second conductive foils;

filling the vias with a conductive material such that the conductive material electrically contacts the first and second conductive foils; and then laminating the first and second plies to opposing surfaces of a clad core laminate comprising a dielectric core between a pair of conductive claddings, the first and second plies being laminated to the clad core laminate such that the first and second dielectric layers overlay the pair of conductive claddings, the conductive material within the vias electrically contacting the pair of conductive claddings of the clad core laminate.

2. A process as recited in claim 1 wherein the forming step includes forming the vias to extend through their respective first and second plies.

3. A process as recited in claim 1 wherein the first and second dielectric layers are formed from a material chosen from the group consisting of glass-reinforced epoxies and polyimides.

4. A process as recited in claim 1 wherein the first and second dielectric layers have a thickness of about twenty-five to about one hundred seventy-five micrometers.

5. A process as recited in claim 1 wherein the conductive material used to fill the vias is chosen from the group consisting of conductive adhesives and conductive inks.

6. A process as recited in claim 1 wherein the forming step includes forming the vias to have diameters of about one hundred to about three hundred micrometers.

7. A process as recited in claim 1 wherein the clad core laminate is a cured laminate.

8. A process as recited in claim 1 wherein the conductive material within the vias substantially prevents flow of the first and second dielectric layers into the vias during the laminating step.

9. A process for forming a multilayer laminated circuit board, the process comprising the steps of:

providing a first uncured dielectric layer bonded to a first conductive foil to form a first ply, and a second uncured dielectric layer bonded to a second conductive foil to form a second ply;

forming vias through the first and second plies so as to extend through the first and second conductive foils;

filling the vias with a conductive material such that the conductive material electrically contacts the first and second conductive foils;

providing a cured core laminate having a dielectric core between a pair of patterned conductive claddings each of the patterned conductive claddings defining at least one conductive runner; and then laminating the first and second plies to opposing surfaces of the cured core laminate such that the first and second dielectric layers overlay the pair of patterned conductive claddings and flow into voids adjacent the conductive runners, the conductive material within the vias electrically contacting the pair of patterned conductive claddings of the cured core laminate.

10. A process as recited in claim 9 wherein the first and second dielectric layers are formed from a material chosen from the group consisting of glass-reinforced epoxies and polyimides.

11. A process as recited in claim 9 wherein the first and second dielectric layers have a thickness of about twenty-five to about one hundred seventy-five micrometers.

12. A process as recited in claim 9 wherein the conductive material used to fill the vias is a conductive adhesive and wherein the forming step includes forming the vias to have diameters of about two hundred to about three hundred micrometers.

13. A process as recited in claim 9 wherein the conductive material used to fill the vias is a conductive ink and wherein the forming step includes forming the vias to have diameters of about one hundred to about three hundred micrometers.

14. A process as recited in claim 9 wherein the conductive material within the vias substantially prevents flow of the first and second dielectric layers into the vias during the laminating step.

15. A process for forming a multilayer laminated circuit board, the process comprising the steps of:

providing a first uncured dielectric layer bonded to a first conductive foil to form a first ply, and a second uncured dielectric layer bonded to a second conductive foil to form a second ply, the first and second uncured dielectric layers being formed from an epoxy resin and having thicknesses of about twenty-five to about one hundred seventy-five micrometers, the first and second conductive foils having thicknesses of at least about eighteen micrometers;

drilling vias through the first and second plies so as to extend through the first and second conductive foils, the vias having diameters of about one hundred to about three hundred micrometers;

filling the vias with a conductive material containing a metal chosen from the group consisting of silver, gold, nickel and copper, the conductive material electrically contacting the first and second conductive foils;

providing a cured core laminate having a dielectric core between a pair of patterned conductive claddings, each of the patterned conductive claddings defining at least one conductive runner; and then laminating the first and second plies to opposing surfaces of the cured core laminate such that the first and second dielectric layers overlay the pair of patterned conductive claddings and flow into voids adjacent the conductive runners, the conductive material within the vias electrically contacting the pair of patterned conductive claddings of the cured core laminate while simultaneously preventing flow of the first and second uncured dielectric layers into the vias.

* * * * *